United States Patent
Takiar et al.

(10) Patent No.: US 7,193,161 B1
(45) Date of Patent: Mar. 20, 2007

(54) SIP MODULE WITH A SINGLE SIDED LID

(75) Inventors: Hem Takiar, Fremont, CA (US); Warren Middlekauff, San Jose, CA (US); Robert C. Miller, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/356,279

(22) Filed: Feb. 15, 2006

(51) Int. Cl.
*H01L 23/28* (2006.01)

(52) U.S. Cl. ........................ 174/521; 361/737; 29/855; 29/856; 257/679

(58) Field of Classification Search ................ 361/737, 361/752; 174/521; 29/855, 856, 841; 257/679
See application file for complete search history.

(56) References Cited

U.S. PATENT DOCUMENTS

| | | | |
|---|---|---|---|
| 6,404,647 B1 * | 6/2002 | Minne' | 361/760 |
| 6,469,902 B1 * | 10/2002 | Puschner et al. | 361/737 |
| 6,483,038 B2 * | 11/2002 | Lee et al. | 174/255 |
| 6,492,717 B1 * | 12/2002 | Gore et al. | 257/679 |
| 6,536,674 B2 * | 3/2003 | Kayanakis et al. | 235/492 |
| 6,567,273 B1 * | 5/2003 | Liu et al. | 361/737 |
| 6,581,840 B2 * | 6/2003 | Takeda et al. | 235/488 |
| 6,628,240 B2 * | 9/2003 | Amadeo | 343/866 |
| 6,628,524 B1 * | 9/2003 | Washino et al. | 361/737 |
| 6,665,192 B2 * | 12/2003 | Wimberger Friedl et al. | 361/752 |
| 6,669,487 B1 * | 12/2003 | Nishizawa et al. | 439/60 |
| 6,728,111 B1 * | 4/2004 | Ku | 361/752 |
| 6,832,731 B2 * | 12/2004 | Kaneko | 235/492 |

* cited by examiner

*Primary Examiner*—Hung V. Ngo
(74) *Attorney, Agent, or Firm*—Vierra Magen Marcus & DeNiro LLP

(57) ABSTRACT

A single-lid flash memory card and methods of manufacturing same are disclosed. The single-sided lid flash memory card may be formed from a semiconductor package having two or more tapered, stepped or otherwise shaped edges capable of securing a single-sided lid thereon. The taper, step or other shape may be fabricated by various methods, including during the molding step or during the singulation step. A semiconductor package having shaped edges may be enclosed within an external lid to form a finished flash memory card. The lid may be applied to a single side of the semiconductor package by various processes, including over-molding, or by pre-forming the lid with interior edges to match the exterior edges of the semiconductor package, and then sliding the lid over the package to form a tight fit therebetween. The shaped edge of the semiconductor package effectively holds the lid securely on the memory card without any adhesives and prevents the lid from dislodging from the semiconductor package.

24 Claims, 8 Drawing Sheets

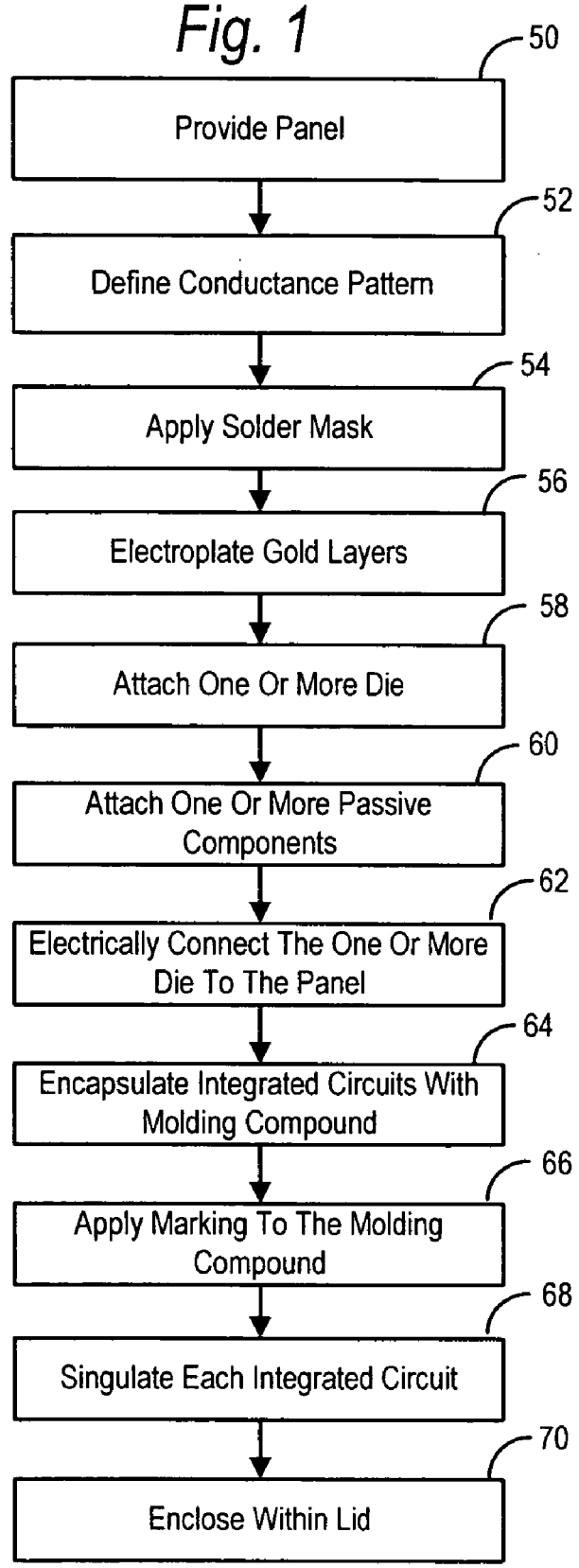

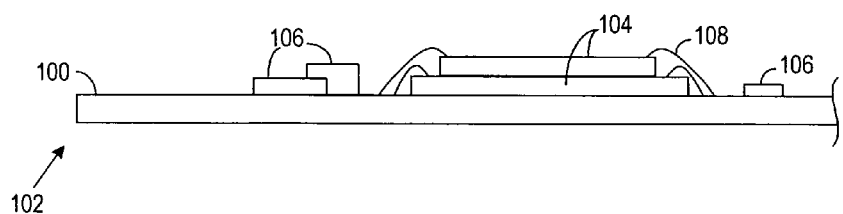
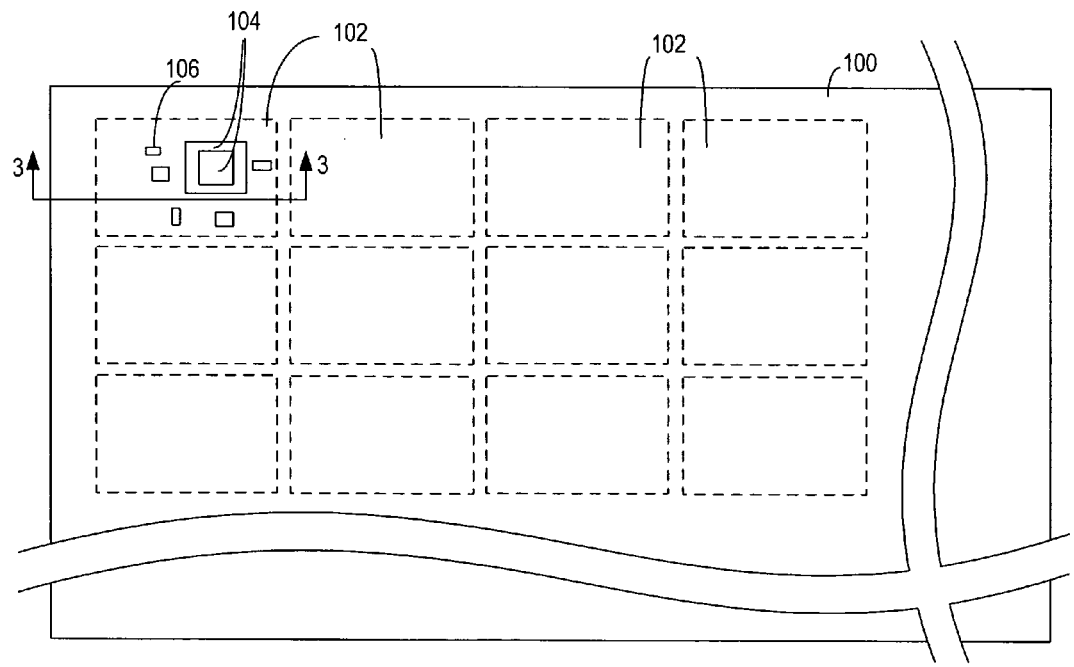

(Line 11-11)

(Line 12-12)

(Line 14-14)

(Line 15-15)

(Line 17-17)

(Line 18-18)

(Line 20-20)

(Line 21-21)

*(Line 23-23)*

*(Line 25-25)*

*(Line 27-27)*

SIP MODULE WITH A SINGLE SIDED LID

BACKGROUND OF THE INVENTION

1. Field of the Invention

Embodiments of the present invention relate to a single-lid flash memory card and methods of manufacturing same.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid base having a conductive layer etched on one or both sides. Electrical connections are formed between the die and the conductive layer(s), and the conductive layer(s) provide an electric lead structure for integration of the die into an electronic system. Once electrical connections between the die and substrate are made, the assembly is then typically encased in a molding compound to provide a protective package.

In view of the small form factor requirements, as well as the fact that flash memory cards need to be removable and not permanently attached to a printed circuit board, such cards are often built of a land grid array (LGA) package. In an LGA package, the semiconductor die are electrically connected to exposed contact fingers formed on a lower surface of the package. External electrical connection with other electronic components on a host printed circuit board (PCB) is accomplished by bringing the contact fingers into pressure contact with complementary electrical pads on the PCB. LGA packages are ideal for flash memory cards in that they have a smaller profile and lower inductance than pin grid array (PGA) and ball grid array (BGA) packages.

Semiconductor die are typically batch processed on a panel and then singulated into individual packages upon completion of the fabrication process. Several methods are known for singulating the semiconductor packages including, for example, sawing, water jet cutting, laser cutting, water guided laser cutting, dry media cutting and diamond coated wire cutting.

Once singulated, fabrication of the flash memory card may be completed by encasing a semiconductor package within a pair of lids. The lids protect the package, as well as cover contacts pads, such as test pads that are left exposed in the package through the molding to allow for electrical test and burn-in after the package has been completed. It is also known to provide only a single lid, on one side of the package, to protect the package and cover exposed contact pads. Such single-sided lids have conventionally been affixed to the semiconductor package using adhesives. However the affixation of single-sided lids using adhesive is difficult to control in production and produces a less reliable flash memory card.

SUMMARY OF THE INVENTION

Embodiments of the present invention relate in general to a single-lid flash memory card and methods of manufacturing same. The single-sided lid flash memory card may be formed from a semiconductor package having two or more tapered, stepped or otherwise shaped edges capable of securing a single-sided lid thereon. The taper, step or other shape may be fabricated by various methods. In one embodiment, a taper, step or other shape may be molded into the edges of the semiconductor packages during the encapsulation process. A mold cap having downwardly extending wedges or other shapes may be used to form the shape of the package edges as desired. In alternative embodiments, the shaped edges may be formed during the singulation step instead of the encapsulation step. In such an embodiment, a blade having tapered edges may be used to singulate the semiconductor packages from a panel, which blade edges would define a taper in the edges of the cut semiconductor packages.

A semiconductor package having shaped edges may be enclosed within an external lid to form a finished flash memory card. The lid may be applied to a single side of the semiconductor package by various processes, including over-molding, or by pre-forming the lid with interior edges to match the exterior edges of the semiconductor package, and then sliding the lid over the package to form a tight fit therebetween. The shaped edge of the semiconductor package effectively holds the lid securely on the memory card without any adhesives and prevents the lid from dislodging from the semiconductor package.

The memory card including the single-sided lid may be formed according to any of a variety of standard card configurations, including for example, an SD Card, a Pico Card, a Compact Flash, a Smart Media Card, a Mini SD Card, an MMC, RS-MMC, an xD Card, a Transflash memory card or a Memory Stick.

BRIEF DESCRIPTION OF THE DRAWINGS

FIG. 1 is a flowchart of the method of fabricating a flash memory card according to embodiments of the present invention.

FIG. 2 is a top view of a portion of a panel of integrated circuits during the fabrication process according to the present invention.

FIG. 3 is a cross-sectional view through line 3—3 in FIG. 2.

DETAILED DESCRIPTION

Figure 4:
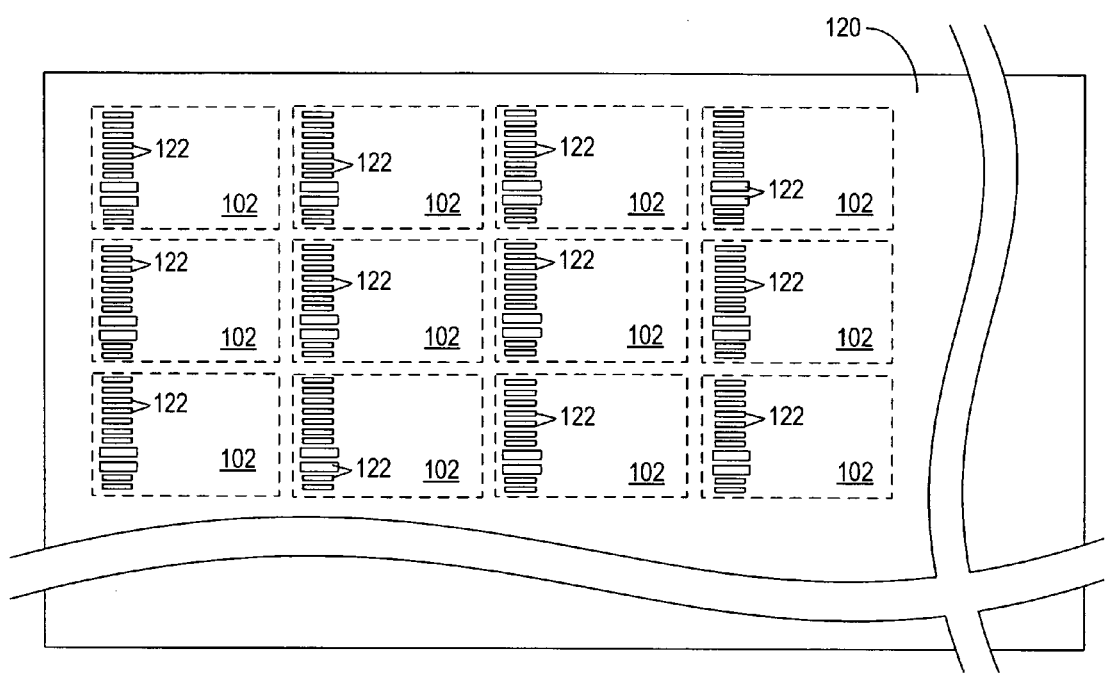
FIG. 4 is a top view of a panel of molded integrated circuits according to embodiments of the present invention prior to being cut into individual integrated circuit packages.

Embodiments of the invention will now be described with reference to FIGS. 1 through 27 which relate to a single-lid flash memory card and methods of manufacturing same. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

In general, the single-sided lid flash memory card is formed from a semiconductor package having two or more tapered, stepped or otherwise shaped edges capable of securing a single-sided lid thereon. A method of fabricating the shaped-edge semiconductor package and affixing the single-sided lid thereto according to embodiments of the present invention will now be described with reference to the flowchart of FIG. 1. The fabrication process begins in step 50 with a panel 100, shown partially for example in FIGS. 2 and 3. The type of panel 100 used in the present invention may for example be a leadframe, printed circuit board ("PCB"), a tape used in tape automated bonding ("TAB") processes, or other known substrates on which integrated circuits may be assembled and encapsulated.

In embodiments where panel 100 is a PCB, the substrate may be formed of a core, having a top conductive layer formed on a top surface of the core, and a bottom conductive layer formed on the bottom surface of the core. Although not critical to the present invention, the core may be formed of various dielectric materials such as for example, polyimide laminates, epoxy resins including FR4 and FR5, bismaleimide triazine (BT), and the like. The conductive layers may be formed of copper or copper alloys, plated copper or plated copper alloys, Alloy 42 (42Fe/58Ni), copper plated steel, or other metals and materials known for use on substrates.

The metal layers of panel 100 may be etched with a conductance pattern in a known process for communicating signals between one or more semiconductor die and an external device (step 52). Once patterned, the substrate may be laminated with a solder mask in a step 54. In embodiments where substrate 100 is used for example as an LGA package, one or more gold layers may be formed on portions of the bottom conductive layer in step 56 to define contact fingers on the bottom surface of the semiconductor package as is known in the art for communication with external devices. The one or more gold layers may be applied in a known electroplating process. It is understood that the semiconductor package according to the present invention need not be an LGA package, and may be a variety of other packages in alternative embodiments including for example BGA packages.

A plurality of discrete integrated circuits 102 may be formed on panel 100 in a batch process to achieve economies of scale. The fabrication of integrated circuits 102 on panel 100 may include the steps 58 and 60 of mounting one or more semiconductor die 104 and passive components 106 on panel 100 for each integrated circuit 102.

The one or more semiconductor die 104 may be mounted in step 58 in a known adhesive or eutectic die bond process, using a known die-attach compound. The number and type of semiconductor die 104 are not critical to the present invention and may vary greatly. In one embodiment, the one or more die 104 may include a flash memory array (e.g., NOR, NAND or other), S-RAM or DDT, and/or a controller chip such as an ASIC. Other semiconductor die are contemplated. The one or more die 114 may be electrically connected to panel 100 by wire bonds 108 in step 62 in a known wire-bond process. The die may be stacked in an SiP arrangement, mounted side-by-side in an MCM arrangement, or affixed in another packaging configuration.

Although not specifically called out on the flowchart of FIG. 1, various visual and automated inspections may be made during the above-described fabrication of the plurality of integrated circuits 102 on panel 100.

Once the plurality of integrated circuits 102 have been formed on panel 100, each of the integrated circuits 102 may be encapsulated with a molding compound 120 in step 64 and as shown in FIG. 4. Molding compound 120 may be an epoxy such as for example available from Sumitomo Corp. and Nitto Denko Corp., both having headquarters in Japan. Other molding compounds from other manufacturers are contemplated. The molding compound may be applied according to various processes, including by transfer molding or injection molding techniques, to encapsulate each of the integrated circuits 102. As shown in FIG. 4, contact fingers 122 may be left exposed.

As indicated above, two or more opposed edges of a semiconductor package may be formed with a taper, a step or other shape for allowing secure affixation of a single-sided lid thereto. The edge shape of the semiconductor package may be fabricated by various methods. In one embodiment, a taper, step or other shape may be molded into the edges of the semiconductor packages during the encapsulation process.

Figure 5:
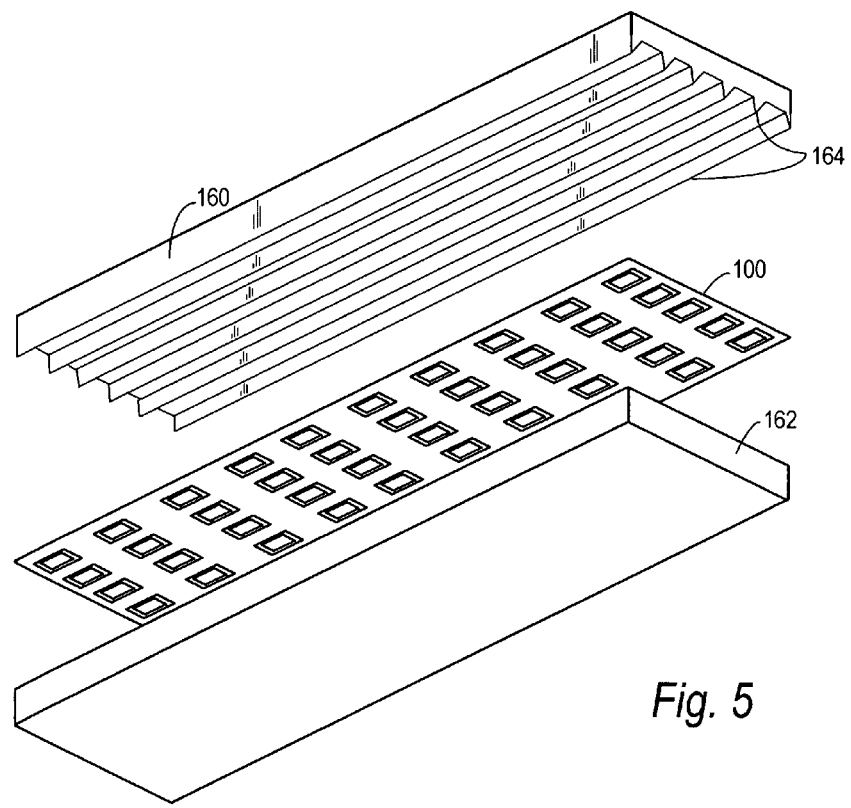
FIG. 5 is a bottom perspective view of molding process die plates used during the molding process to encapsulate the integrated circuits on the panel.

For example, FIG. 5 illustrates upper and lower mold cap die plates 160 and 162. As shown, upper mold cap die plate 160 a plurality of downwardly extending wedges 164. During the molding process, a panel 100 may be put between mold cap die plates 160, 162. When the die plates are brought together and the mold compound introduced between the plates, the wedges 164 prevent deposition of molding compound in the areas of the wedges, and thus define a taper along the edges of the semiconductor packages once singulated.

It is understood that other patterns of protrusions may be formed on upper or lower mold cap die plate 160 to form a variety of shapes along the edges of the semiconductor packages, including for example a stepped edge. As explained hereinafter, the shaped edge may be formed during the singulation step instead of the encapsulation step. In such an embodiment, the panel 100 may be encapsulated in molding compound without edges defined in the molded compound (thus, the downwardly extending wedges 154 or other shapes may be omitted from the die plates 160, 162).

Although shown with a generic rectangular shape in FIG. 4, the molded integrated circuits may have irregular shapes in embodiments. A method for forming irregular shaped semiconductor packages is disclosed for example in U.S. patent application Ser. No. 11/265,337, entitled "Method of Manufacturing Flash Memory Cards," which application is assigned to the owner of the present application and which application is incorporated by reference herein in its entirety.

After molding step 64, a marking can be applied to the molding compound 120 in step 66. The marking may for example be a logo or other information printed on the surface of the molding compound 120 for each integrated circuit 102. The marking may for example indicate manufacturer and/or type of device. Marking step 66 may be omitted in alternative embodiments of the present invention.

Each of the integrated circuits 102 may next be singulated in step 68. Singulation step 68 involves cutting integrated circuits 102 on panel 100 into a plurality of individual semiconductor packages. As indicated above, the semiconductor packages may include a shaped edge formed during the encapsulation process. In alternative embodiments, the shaped edge may be formed during the singulation step instead of the encapsulation step. In such an embodiment, the panel 100 may be cut with a blade having tapered edges. Such a cut would define a taper in the edges of the cut semiconductor packages. It is understood that other cutting methods may be used to form the desired shape in the edges of the semiconductor package, such as for example, water jet cutting, laser cutting, water guided laser cutting, dry media cutting and diamond coated wire cutting. It is further understood that other shapes, such as the stepped configuration, may be obtained in the edges by various known cutting methods.

Figure 6:
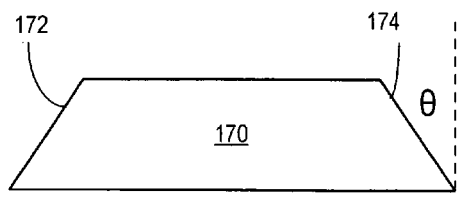
FIG. 6 is an end view of a semiconductor package having tapered edges according to embodiments of the invention.
Figure 7:
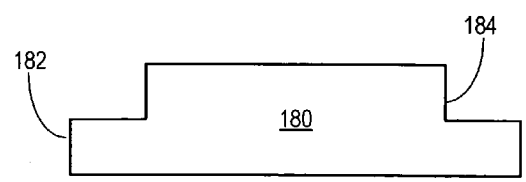
FIG. 7 is an end view of a semiconductor package having stepped edges according to embodiments of the invention.

FIGS. 6 and 7 illustrate end views of a semiconductor package formed by the above-described steps. FIG. 6 shows a semiconductor package 170 having tapered edges 172 and 174. Edges 172 and 174 may be any two opposed edges of the four edges of semiconductor package 170. It is further contemplated that three or all four of the edges of semiconductor package 170 may include a taper formed by the above-described steps. The taper may form an angle, θ, of between 2° and 45° in embodiments, and between 5° and 30° in further embodiments. It is understood that the angle, θ, may be less than 2° and greater than 45° in further embodiments.

FIG. 7 shows a semiconductor package 180 including stepped edges 182 and 184. Edges 182 and 184 may be any two opposed edges of the four edges of semiconductor package 180. It is further contemplated that three or all four of the edges of semiconductor package 180 may include a step formed by the above-described steps. It is further contemplated that different edges may have different shapes. Thus, for example, a first edge may be tapered, and a second, opposed edge may be stepped.

Figure 8:
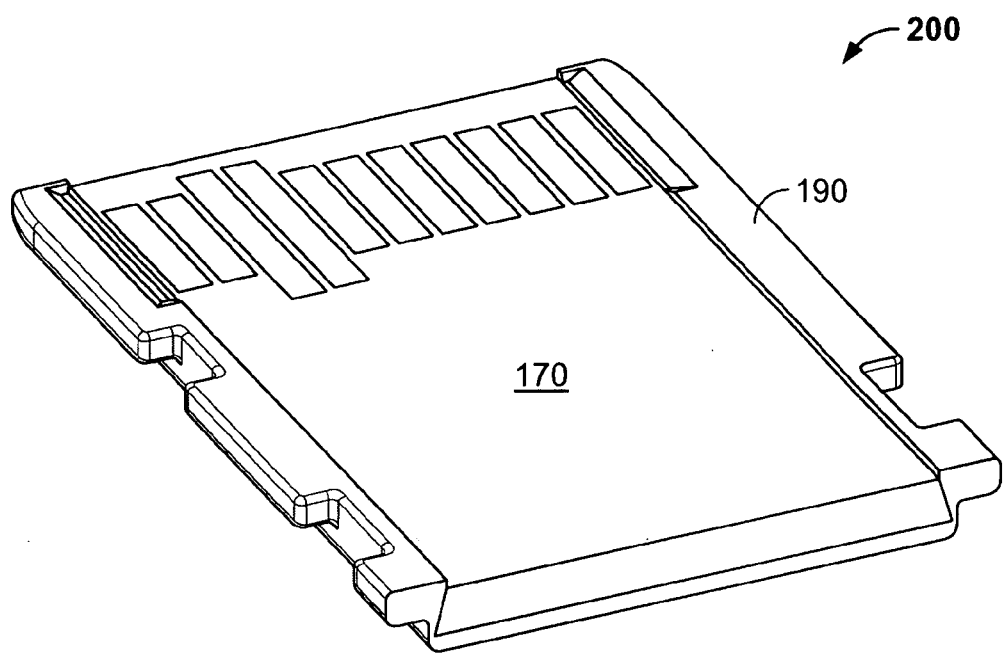
FIG. 8 is a perspective view of a flash memory card including a single-sided lid held on a semiconductor package by tapered edges of the package.
Figure 9:
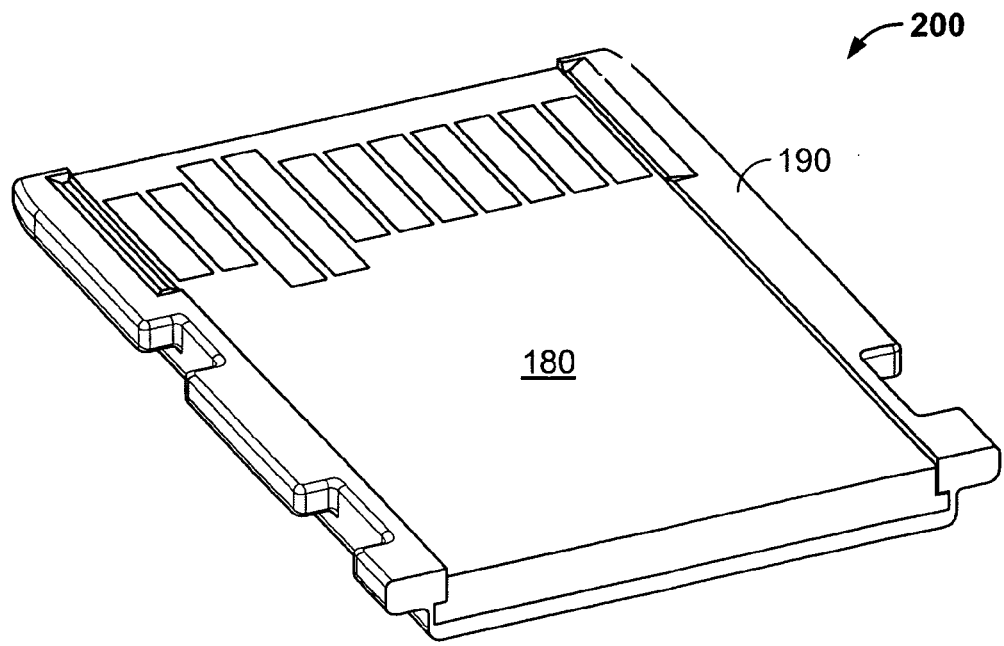
FIG. 9 is a perspective view of a flash memory card including a single-sided lid held on a semiconductor package by stepped edge of the package.
Figure 10:
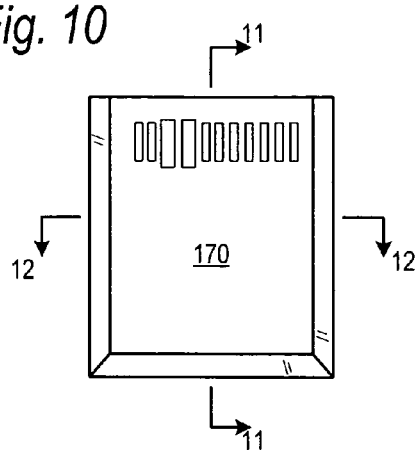
FIG. 10 is a top view of a flash memory card including three tapered edges.

Referring again to the flowchart of FIG. 1 and the views of FIGS. 8 and 9, a semiconductor package (e.g., packages 170 and 180) may further be enclosed within an external lid 190 in step 70 to form a finished flash memory card 200. Such a lid 150 would provide an external covering for the semiconductor package and establish external product features (for example any notches, chamfers, etc. to aid in proper insertion of the card 200 in a host device).

Lid 190 may be applied to a single side of the semiconductor package, for example, on a side opposite the side including the contact fingers 122. The lid 190 may be applied by various processes, for example by over-molding. In such a process, a semiconductor package 170, 180 may be put into an injection molding press and positioned in a fixed and registered position (such as for example by guide pins). Molten plastic or the like may then flow into the mold around the semiconductor package. The semiconductor package is positioned in the mold so that the plastic surrounds a first side of the package (i.e., the bottom in the view of FIGS. 8 and 9) and two to four of the edges of the package. The second side of the package opposite the first side may remain free of plastic. The plastic hardens and the finished card 200 is removed from the mold.

As an alternative to an over-molding process, a lid may be formed independently of the semiconductor package, and be formed with an interior edge profile matching the exterior edge profile of the semiconductor package. The lid may then be slid over the semiconductor package to form a tight, mating fit between the lid and semiconductor package.

As shown in FIGS. 8 and 9, the package is wider along the first side (i.e., the bottom in the view of FIGS. 8 and 9) than at the second side having no lid. The wider dimension holds the lid 190 securely on the card 200 without any adhesives and prevents the lid 190 from dislodging from the semiconductor package.

Figure 11:
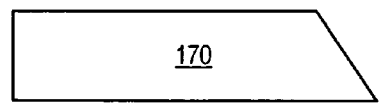
FIG. 11 is a cross-section through line 11—11 in FIG. 10.
Figure 12:
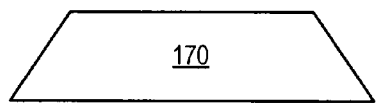
FIG. 12 is a cross-section through line 12—12 in FIG. 10.
Figure 13:
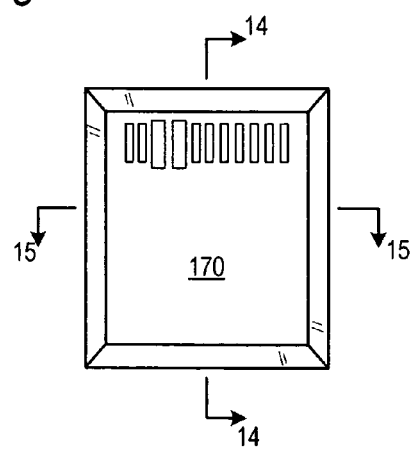
FIG. 13 is a top view of a flash memory card including four tapered edges.
Figure 14:
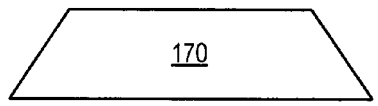
FIG. 14 is a cross-section through line 14—14 in FIG. 11.
Figure 15:
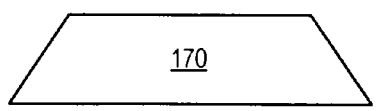
FIG. 15 is a cross-section through line 15—15 in FIG. 11.
Figure 16:
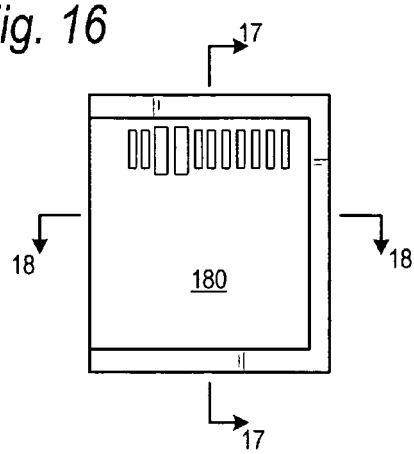
FIG. 16 is a top view of a flash memory card including three stepped edges.
Figure 17:
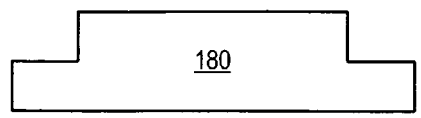
FIG. 17 is a cross-section through line 17—17 in FIG. 16.
Figure 18:
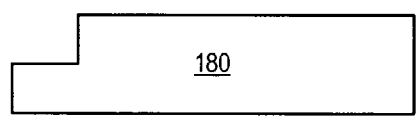
FIG. 18 is a cross-section through line 18—18 in FIG. 16.
Figure 19:
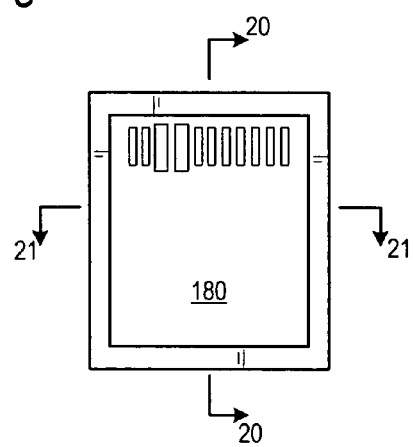
FIG. 19 is a top view of a flash memory card including four stepped edges.
Figure 20:
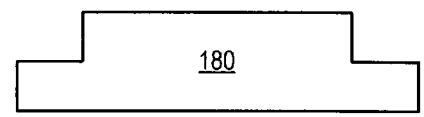
FIG. 20 is a cross-section through line 20—20 in FIG. 19.
Figure 21:
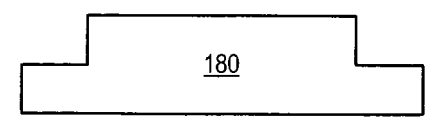
FIG. 21 is a cross-section through line 21—21 in FIG. 19.
Figure 22:
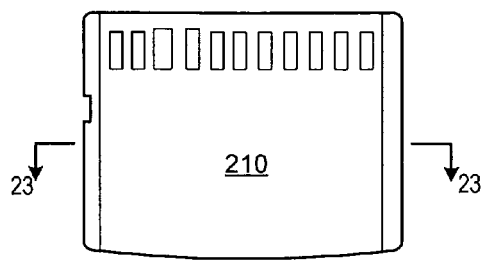
FIGS. 22 through 27 are top and cross-section views of three different memory cards which may be formed with shaped edges according to embodiments of the present invention.

As indicated above, embodiments of the present invention may employ different numbers of sides having tapered or stepped edges. The top view of FIG. 10 and the cross-section views of FIGS. 11 and 12 illustrate an embodiment where three sides of a semiconductor package 170 have a tapered edge. The top view of FIG. 13 and the cross-section views of FIGS. 14 and 15 illustrate an embodiment where four sides of a semiconductor package 170 have a tapered edge. Likewise, the top view of FIG. 16 and the cross-section views of FIGS. 17 and 18 illustrate an embodiment where three sides of a semiconductor package 180 have a stepped edge. The top view of FIG. 19 and the cross-section views of FIGS. 20 and 21 illustrate an embodiment where four sides of a semiconductor package 170 have a stepped edge.

Figure 23:
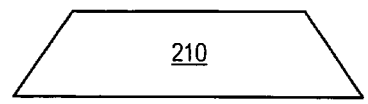
Figure 24:
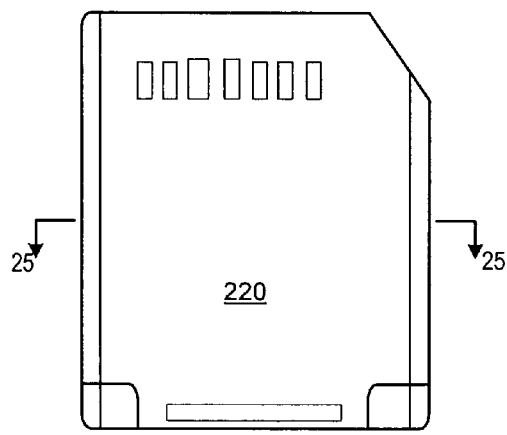
Figure 25:
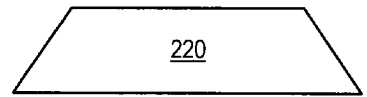
Figure 26:
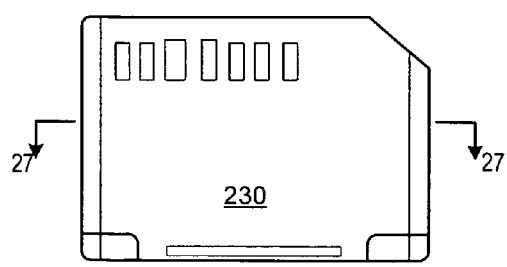
Figure 27:
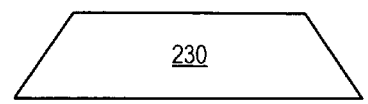

The memory card 200 including the single-sided lid 190 may be formed according to any of a variety of standard card configurations. For example, FIGS. 8 and 9 illustrate a Pico card. The top view of FIG. 22 and cross-section view of FIG. 23 illustrate a semiconductor package 210 including tapered edges according to embodiments of the present invention for an xD card. The top view of FIG. 24 and cross-section view of FIG. 25 illustrate a semiconductor package 220 including tapered edges according to embodiments of the present invention for an MMC card. And the top view of FIG. 26 and cross-section view of FIG. 27 illustrate a semiconductor package 230 including tapered edges according to embodiments of the present invention for an RS-MMC card. Although two tapered edges are shown in each of FIGS. 22–27, it understood that three or four edges may be shaped, and that they may be shaped with other configurations, including steps. It is further understood that other cards may be formed with shaped edges, including for example, an SD Card, a Compact Flash, a Smart Media Card, a Mini SD Card, a Transflash memory card or a Memory Stick. Other devices are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package for receiving a one-sided lid, the semiconductor package comprising:
   a first surface intended to be covered by the lid when the lid is received;
   a second surface opposite the first surface, the second surface intended to be left uncovered when the lid is received;
   a first edge extending between the first and second surfaces; and
   a second edge, opposite to the first edge and extending between the first and second surfaces;
   the first and second edges having a shape defining a first distance perpendicularly between the first and second edges at the first surface that is greater than a second distance perpendicularly between the first and second edges at the second surface.

2. A semiconductor package as recited in claim 1, wherein the shape of the first and second edges includes a taper that tapers from wider at the first surface to narrower at the second surface.

3. A semiconductor package as recited in claim 1, wherein the shape of the first and second edges includes a step that steps from wider at the first surface to narrower at the second surface.

4. A semiconductor package as recited in claim 1, further comprising contact fingers in the second surface for establishing electrical connection between the semiconductor package and a host device.

5. A semiconductor package as recited in claim 1, wherein the semiconductor package is a flash memory semiconductor package.

6. A flash memory, comprising:
   a semiconductor package, including:
      a first surface,
      a second surface opposite the first surface,
      a first edge extending between the first and second surfaces, and
      a second edge, opposite to the first edge and extending between the first and second surfaces,
      the first and second edges having a shape defining a first distance perpendicularly between the first and second edges at the first surface that is greater than a second distance perpendicularly between the first and second edges at the second surface; and
   a lid for fitting over the first surface and the first and second edges of the semiconductor package.

7. A flash memory as recited in claim 6, wherein the first and second edges are capable of exerting a force on the lid opposing separation of the lid and semiconductor package.

8. A flash memory as recited in claim 6, wherein the shape of the first and second edges includes a taper that tapers from wider at the first surface to narrower at the second surface.

9. A flash memory as recited in claim 6, wherein the shape of the first and second edges includes a step that steps from wider at the first surface to narrower at the second surface.

10. A flash memory as recited in claim 6, further comprising contact fingers in the second surface for establishing electrical connection between the semiconductor package and a host device.

11. A flash memory as recited in claim 6, wherein the flash memory is one of an SD Card, a Pico Card, a Compact Flash, a Smart Media Card, a Mini SD Card, an MMC, an RS-MMC, an xD Card, a Transflash memory card and a Memory Stick.

12. A method of forming a flash memory from a panel, comprising the steps of:
   a) forming a plurality of integrated circuits on the panel;
   b) encapsulating the plurality of integrated circuits with a molding compound;
   c) singulating a plurality of semiconductor packages from the panel;
   d) defining a taper in first and second opposed edges of a semiconductor package of the plurality of semiconductor packages, the first and second opposed edges extending between first and second surfaces of the semiconductor package, the taper providing a larger diameter to the first surface than the second surface; and
   e) affixing a lid to the first surface of the semiconductor package, the taper in the first and second edges capable of exerting a force on the lid opposing separation of the lid and semiconductor package.

13. A method as recited in claim 12, wherein said step d) of defining a taper in first and second opposed edges of a semiconductor package of the plurality of semiconductor packages is performed as part of said step b) of encapsulating the plurality of integrated circuits with a molding compound.

14. A method as recited in claim 13, wherein said step b) of encapsulating the plurality of integrated circuits with a molding compound includes the step of positioning the panel between first and second plates, the first die plate including protrusions for defining the taper of said step d).

15. A method as recited in claim 12, wherein said step d) of defining the taper in first and second opposed edges of a semiconductor package of the plurality of semiconductor packages is performed as part of said step c) of singulating a plurality of semiconductor packages from the panel.

16. A method as recited in claim 15, wherein said step c) of singulating the plurality of semiconductor packages from the panel includes the step of cutting the panel with a blade having a tapered edge.

17. A method as recited in claim 12, wherein said step e) of affixing a lid to the first surface of the semiconductor package comprises the step of over-molding the lid to the semiconductor package.

18. A method as recited in claim 12, wherein said step e) of affixing a lid to the first surface of the semiconductor package comprises the steps of forming the lid with interior edges having shapes capable of mating with the shapes of the first and second edges of the semiconductor package, and sliding the lid over the semiconductor package so that interior edges of the lid mate with the first and second edges of the semiconductor package.

19. A method of forming a flash memory from a panel, comprising the steps of:
   a) forming a plurality of integrated circuits on the panel;
   b) encapsulating the plurality of integrated circuits with a molding compound;

c) singulating a plurality of semiconductor packages from the panel;

d) defining a step in first and second opposed edges of a semiconductor package of the plurality of semiconductor packages, the first and second opposed edges extending between first and second surfaces of the semiconductor package, the step providing a larger diameter to the first surface than the second surface; and e) affixing a lid to the first surface of the semiconductor package, the step in the first and second edges capable of exerting a force on the lid opposing separation of the lid and semiconductor package.

20. A method as recited in claim 19, wherein said step d) of defining a step in first and second opposed edges of a semiconductor package of the plurality of semiconductor packages is performed as part of said step b) of encapsulating the plurality of integrated circuits with a molding compound.

21. A method as recited in claim 20, wherein said step b) of encapsulating the plurality of integrated circuits with a molding compound includes the step of positioning the panel between first and second plates, the first die plate including protrusions for defining the step of said step d).

22. A method as recited in claim 19, wherein said step d) of defining the step in first and second opposed edges of a semiconductor package of the plurality of semiconductor packages is performed as part of said step c) of singulating a plurality of semiconductor packages from the panel.

23. A method as recited in claim 19, wherein said step e) of affixing a lid to the first surface of the semiconductor package comprises the step of over-molding the lid to the semiconductor package.

24. A method as recited in claim 19, wherein said step e) of affixing a lid to the first surface of the semiconductor package comprises the steps of forming the lid with interior edges having shapes capable of mating with the shapes of the first and second edges of the semiconductor package, and sliding the lid over the semiconductor package so that interior edges of the lid mate with the first and second edges of the semiconductor package.

* * * * *